United States Patent [19]

Hastings et al.

[11] Patent Number: 4,929,900

[45] Date of Patent: May 29, 1990

[54] METHOD FOR LOCATING CONDUCTIVE FAULTS IN TELEPHONE AND SIMILAR CABLES

[75] Inventors: Mark W. Hastings, Weatherford; James M. Buzbee, Mineral Wells, both of Tex.

[73] Assignee: Industrial Technology, Inc., Mineral Wells, Tex.

[21] Appl. No.: 356,646

[22] Filed: May 19, 1989

Related U.S. Application Data

[63] Continuation of Ser. No. 138,939, Dec. 29, 1987, abandoned.

[51] Int. Cl.$^5$ ............................................. G01R 31/08
[52] U.S. Cl. ..................................... 324/525; 324/527; 324/541
[58] Field of Search ............... 324/522, 523, 525, 527, 324/539, 541, 543, 544; 379/26, 30

[56] References Cited

U.S. PATENT DOCUMENTS

| | | | |
|---|---|---|---|
| 1,084,910 | 1/1914 | Stephenson | 324/523 |
| 2,615,076 | 10/1952 | Miller | 324/525 |
| 3,248,646 | 4/1966 | Brazee | 324/525 X |
| 3,284,704 | 11/1966 | Lamont | 324/539 X |
| 4,446,421 | 5/1984 | Berde | 324/523 |
| 4,751,724 | 6/1988 | Amadio et al. | 379/26 X |

Primary Examiner—Reinhard J. Eisenzopf
Assistant Examiner—Robert W. Mueller
Attorney, Agent, or Firm—William T. Wofford; James C. Fails; Geoffrey A. Mantooth

[57] ABSTRACT

The resistance of a cable conductor between a measuring point and a conductive fault is measured using an electronically regulated current source and a very high resistance voltmeter in such a way as to eliminate contact and fault resistance as a source of error. Distance to the fault is determined by calculation from the known resistance per unit length.

4 Claims, 1 Drawing Sheet

METHOD FOR LOCATING CONDUCTIVE FAULTS IN TELEPHONE AND SIMILAR CABLES

This is a continuation of co-pending application Ser. No. 07/138,939 filed Dec. 29, 1987, now aband.

FIELD OF THE INVENTION

The invention relates to the location of conductive faults in telephone and similar shielded cables.

BACKGROUND OF THE INVENTION

Location of conductive faults in telephone and similar shielded cables is most often accomplished by measuring the resistance of one of the faulted conductors between a reference point and the fault. Actual distance is determined by calculation using the known resistance per unit length and the measured resistance.

Current practice is to make the resistance measurement with an electrical bridge which is made up of the faulted conductors and one or more non-faulted conductors which may or may not be in the same cable. The arrangement is such that the fault resistance ends up in one of the power supply leads to the bridge and not within the bridge loop itself. The conductor between the reference point and the fault; however, becomes one of the bridge arms and its resistance is determinable by ratiometric means to the resistance of the non-faulted conductor. The resistance of the non-faulted conductor is known or is readily measureable, since its end point is known and accessible. Conventional forms of the bridge arrangement are known as Varley bridges and Murray loops and are well covered in contemporary engineering literature.

These bridges have shortcomings which make them difficult to use in some situations, notably when any of the parameters or external interfering voltages are varying. Often the fault is due to water in the cable. This causes conduction between conductors or from a conductor to the shield which, when it becomes great enough, constitutes a fault. Other conductors, which have voltage on them may have faults to the faulted conductors and thus inject interfering currents into the fault. Electrical current through any of the water based paths will both electrolyze the water and tend to dry out the fault. Furthermore, the non-faulted reference conductor and its connection to the faulted conductor is a temporary arrangement which may have unexpectedly large and unstable series resistance. In this condition bridge parameters will be varying with time and it is more difficult to balance the bridge. Furthermore, the mere task of balancing a bridge, even when the parameters are constant, is a slow and tedious process.

It is the objective of this invention to provide an improved method for locating conductive faults in telephone and similar shielded cables.

DESCRIPTION OF PREFERRED EMBODIMENT

Figure 1:
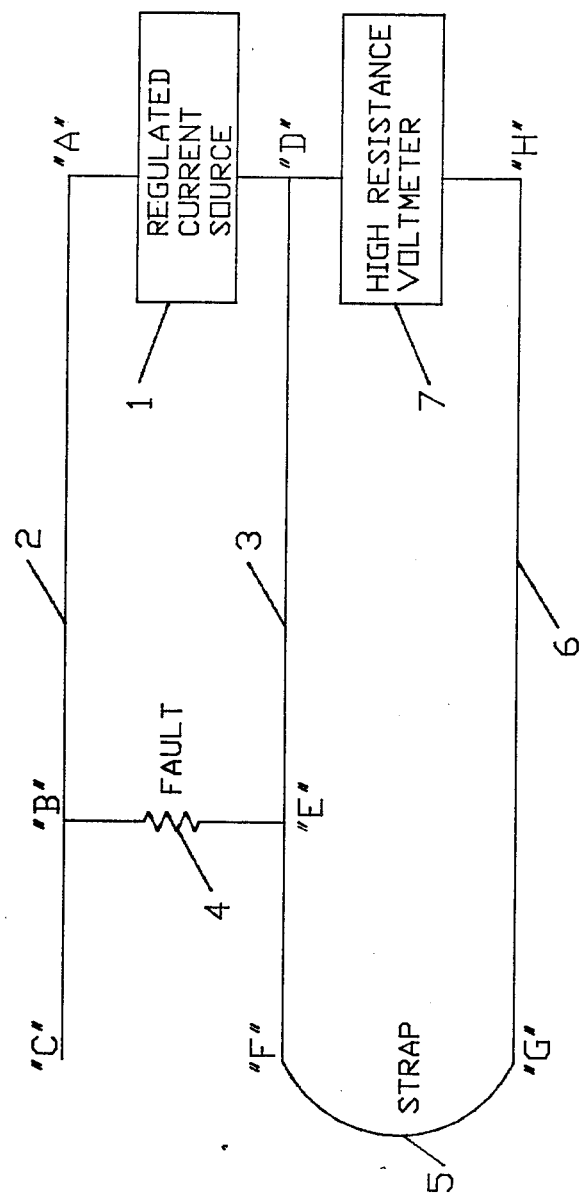
FIG. 1 is a schematic diagram showing apparatus and circuitry to be used to practice the method of the invention in accordance with a preferred embodiment.

In our invention a novel approach to measurement of the resistance between a reference point and the fault is employed. Use of our method is illustrated in FIG. 1. Here an electronically regulated constant current source, 1, forces a known and constant current through a faulted conductor, 2, an unknown fault resistance, 4, and a faulted conductor, 3. One of the faulted conductors, say 3, is connected, at a point "F", beyond the fault, to another non-faulted conductor, 6, at a point "G" with a strap connection. This non-faulted conductor extends to the location of the constant current source. A high resistance voltmeter is connected to the ends (points "D", "H") of the conductors 3 and 6 opposite the strap. The resistance of this voltmeter must be high enough that current flow through it is negligible compared to the regulated current under all conditions of fault and conductor resistance within the measuring range desired, and its resistance must be high compared to that of any of the conductors. Suitable current regulated sources and high resistance voltmeters are commonly available and their design is not part of our invention.

In practice the current flows from the regulated current source, 1, through point "A" to point "B" of conductor 2, thence through fault resistance, 4, to point "E", back through a portion of conductor 4 to point "D" and thence to the regulated current source. This current is known and constant, regardless of the resistance of the conductors or the fault, within the range of the setup. Because conductor 3 has an unknown resistance between points "D" and "E" there will be a voltage drop across this section of conductor 3 which is directly proportional to its resistance. Because the current from point "E" to point "H", through conductors 3 and 6 and the strap is negligible the voltmeter will accurately read this voltage drop regardless of the resistance of the conductors 3 and 6. Knowing the voltage drop and the current causing it allows calculation of the resistance and hence the distance from point "D" to point "E" along conductor 3. It is understood, of course, that points "A", "D" and "H" are at the location of the regulated current source 1 and high resistance voltmeter 7; and that the points "B", "E" are at the fault location.

A number of enhancements to this basic invention are anticipated. The voltmeter may be calibrated to read directly in distance and the sensitivity may be adjusted with calibrated variable resistors to compensate this distance reading for wire gage and temperature. Alternately the value of the regulated current can be adjusted to compensate for wire gage and temperature. A zero adjustment can be added to the meter to zero out any voltage contributed by leakage to other pairs with voltage on them. All compensation adjustments, and conversions can be accomplished automatically by adding a microprocessor to the equipment used to practice our method. All of these enhancements are also used with the Varley and Murray methods and are not claimed as part of our invention.

An advantage of our method is elimination of the necessity for adjusting the apparatus for a null which both saves time and allows operation by less skilled persons. Another advantage is that steady and accurate measurements can be made even when the fault resistance or strap and non-faulted conductor resistance is changing.

We claim:

1. A method of locating a conductive fault in a telephone or similar shielded cable, comprising the steps of;
   a. connecting a constant current source and establishing a known and constant current flow from the constant current source located at a reference point location through a first faulted conductor, an unknown fault resistance and a second faulted conductor and back to the constant current source;
b. connecting said second faulted conductor at a point beyond the fault to a non-faulted conductor which extends to the reference point location;
c. connecting a high resistance voltmeter and measuring the voltage between the second faulted conductor and the non-faulted conductor at the reference point location, with the resistance of said high resistance voltmeter being such that the current flow through it is negligible when compared with said constant current;
d. utilizing the magnitude of the known current flow in said second faulted conductor between said reference point location and the fault location and the magnitude of the voltage indicated by said high resistance voltmeter to determine the distance from said reference point location to the fault location.

2. A method of locating a conductive fault between first and second conductors in a cable, said fault occurring between first and second locations along said cable, there being a third conductor extending between said first and second cable locations, comprising the steps of:
a. connecting a constant current source at said first cable location to said first and second conductors;
b. connecting a high resistance voltmeter to said second a third conductors at one of said first or second cable locations;
c. connecting said third conductor to said second conductor at the other of said first or second cable locations which is unconnected to said voltmeter;
d. establishing a known and constant current through said second conductor with said current source;
e. measuring the voltage between said second and third conductors with said voltmeter, said voltage being measured such that said voltage measurement introduces negligible current into said second conductor relative to said known current;
f. determining the resistance of said second conductor from said first cable location to said fault by taking the ratio of said measured voltage to said established current, whereby said determined resistance indicates the distance of said fault from said first cable location.

3. A method of locating a conductive fault between first and second conductors in a cable, said fault occurring between first and second locations of said cable, comprising the steps of:
a. at said second cable location, connecting said second conductor to a third conductor, said third conductor being non-faulted, said third conductor extending to said first cable location;
b. at said first cable location, establishing a known and constant current through said first conductor, said fault, and second conductor back to said first cable location;
c. at said first cable location, measuring the voltage between said second conductor and said third conductor, said voltage measurement introducing negligible current into said second conductor relative to said established known current;
d. determining the resistance of said second conductor from said first cable location to said fault by taking the ratio of said measured voltage to said established current, whereby said determined resistance indicates the distance of said fault from said first cable location.

4. A method of locating a conductive fault between first and second faulted conductors in a cable, said fault occurring between first and second locations of said cable, comprising the steps of:
a. connecting a constant current source at said first cable location and establishing a known and constant current through said first conductor, said fault, and said second conductor back to said first cable location;
b. at said second cable location, connecting said second conductor to a third conductor, said third conductor being non-faulted, said third conductor extending to said first cable location;
c. connecting a high resistance voltmeter between said second and third conductors at said first cable location and measuring the voltage between said second and third conductors, said voltage measurement introducing negligible current into said second conductor relative to said established known current;
d. determining the resistance of said second conductor from said first cable location to said fault by taking the ratio of said measured voltage to said established current, whereby said determined resistance indicates the distance of said fault from said first cable location.

* * * * *